United States Patent [19]

Choi

[11] Patent Number: 5,418,746

[45] Date of Patent: May 23, 1995

[54] WRITE SIGNAL INPUT BUFFER FOR A SEMICONDUCTOR MEMORY DEVICE

[75] Inventor: Hoon Choi, Kyungki-do, Rep. of Korea

[73] Assignee: Samsung Electronics Co., Ltd., Kyungki-do, Rep. of Korea

[21] Appl. No.: 217,899

[22] Filed: Mar. 25, 1994

[30] Foreign Application Priority Data

Apr. 8, 1993 [KR] Rep. of Korea ................. 1993-5888

[51] Int. Cl.[6] ............................................... G11C 7/00
[52] U.S. Cl. ........................... 365/189.05; 365/189.01
[58] Field of Search ................ 365/189.05, 189.01, 365/230.08; 307/279

[56] References Cited

U.S. PATENT DOCUMENTS

| | | | |
|---|---|---|---|
| 4,794,567 | 12/1988 | Akatsuka | 365/189.05 |
| 5,278,789 | 1/1994 | Inoue et al. | 365/189.01 |
| 5,305,271 | 4/1994 | Watanabe | 365/205 |
| 5,323,346 | 6/1994 | Takahashi | 365/189.01 |

FOREIGN PATENT DOCUMENTS

| | | | |
|---|---|---|---|
| 0017894 | 1/1991 | Japan | 365/189.05 |
| 0160691 | 7/1991 | Japan | 365/189.05 |

*Primary Examiner*—Joseph A. Popek
*Assistant Examiner*—Son Dinh
*Attorney, Agent, or Firm*—Stephen R. Whitt; Robert A. Westerlund; Charles R. Donohoe

[57] ABSTRACT

The present invention relates to a write signal input buffer, among input buffers of semiconductor memory device, for receiving a write enable signal supplied from the exterior of chip. The present invention provides a write signal input buffer at least having an input stage for receiving a write enable signal supplied from the exterior of chip, logic means for generating a write drive signal as a correspondence signal according to an output signal of the input stage, and a latch portion for latching an output signal of the logic means and including switching means controlled by a drive signal of data output stage circuit on its latch path. Accordingly, normal driving operation is carried out according to input of external write enable signal regardless of the ground noise induced in data output operation, thereby guaranteeing a correct write operation of chip. Operational characteristics related to timing can be improved when the chip is mounted in the system since stable and accurate driving in write operation is obtained. Also, the reliability of semiconductor integrated circuit related to write operation can be improved.

3 Claims, 4 Drawing Sheets

WRITE SIGNAL INPUT BUFFER FOR A SEMICONDUCTOR MEMORY DEVICE

BACKGROUND OF THE INVENTION

The present invention relates to an input buffer for a semiconductor memory device. More particularly, the present invention relates to a write signal input buffer receiving an externally supplied write enable signal, and providing a write drive signal as an internal control signal within the memory device.

Conventional semiconductor memory devices typically include various input buffers receiving externally generated address signals, data signals, and control signals. Each buffer acts as an input stage to circuits within the memory device, receiving the external signals, converting the external signals into compatible internal signals, and providing the internal signals to respective circuits within the memory device. Of particular relevance, conventional memory devices include a write enable signal input buffer (hereinafter referred to as "write signal input buffer") which receives a write enable control signal, and provides a corresponding master clock control signal which drives, or enables, respective circuits within the memory device. The write enable signal is typically supplied from a system or CPU external to the memory device. The master clock signal timing, and thus the entire "enablement" sequence of the respective circuits within the memory device is determined according to the timing Of the write drive signal. Examples of internal circuits efficiently enabled or driven by a master clock signal derived from a write enable signal include data transfer circuits, control circuits, data input/output circuits, etc.

Unfortunately, the actual implementation of internal memory device circuits whose operation is enabled by the write drive signal presents a very difficult problem. The problem arises in that the respective circuits must be designed such that they are synchronous in operation with the timing waveform of the write drive signal. In other words, the externally supplied write drive signal defines the enablement window during which the internal circuits within the memory device are operated.

As is well known, signals such as the write drive signal supplied from the overall system controller or CPU have very short enabling intervals. Accordingly, internal signals provided by input buffers, responsive to signals such as the write drive signal, are enabled during a correspondingly brief interval. Controlling the operation of internal circuits in accordance with the write drive signal during this extremely short interval is rarely possible in a highly integrated, semiconductor memory device. This is true because of the very tight timing margins required for data transfer within the memory device, and because of the risk of falsing, i.e., the erroneous transition of data in response to a spuriously generated signal.

To solve such problems, a method of lengthening the "enabling" interval of a write drive signal has been proposed, wherein a latch circuit is added to the input buffer described above. As shown in FIG. 1, regardless of the actual enabling interval of an externally generated write enable signal WE, the latch circuit may "hold" the signal for a predetermined period of time.

Referring to FIG. 1, the write enable signal WE is externally supplied to WE(not) terminal 2. Assuming that WE is enabling when "high" or "1", the voltage apparent at node 14 rises to $V_{cc}$ when WE is applied. In response to the positive voltage at node 14, the output at NOR gate 16 becomes "low" or "0." Coincident with the application of WE, if a column enable signal $\phi C$ is applied in "high" a state as a clocking input, the output at NOR gate 20 becomes "high." This result is output as write drive signal $\phi WR$.

The output of NOR gate 20, $\phi WR$, is feedback to NOR gate 16 via line 24. Thus, $\phi WR$ remains "low" beyond the duration of the externally supplied write enable signal WE, and $\phi WR$ is "latched" by the inclusion of line 24 within the conventional input buffer. The foregoing feedback/latching scheme addresses, at least in part, the problem of designing internal circuits within the memory device controlled, or enabled by the write drive signal $\phi WR$ by providing a write drive signal $\phi WR$ having a longer enabling interval.

The operation of the conventional input buffer, shown for example in FIG. 1, and the resulting write drive signal $\phi WR$ are further illustrated in steps e1 through e5 in the operational timing diagram shown in FIG. 2. As shown in e5 of FIG. 2, the write drive signal $\phi WR$ follows the voltage at node 14 and goes "high" in accordance with the column enable signal $\phi C$ and write enable signal WE.

Despite the improved performance over the conventional input buffer not having a feedback/latching path, the write signal input buffer shown in FIGS. 1 and 2 has at least one serious problem. Typical semiconductor memory devices include a data output buffer and a data output driver (not shown) which form an output stage supplying data outside the memory device during read operations. As is well known, the foregoing output stage operates synchronously with a column address strobe signal CAS(not) as shown in steps e1, e6, e7, and e8 of FIG. 2. When the data output driver is turned on, large ground noise is induced by the switching operation of transistors constituting the data output driver. The presence of the ground noise causes the gate-to-source voltage $V_{GS}$ of transistor 6 in FIG. 1 to fall below the switching threshold regardless of the presence of the write enable signal WE. As a result, the voltage at node 8 rises above the $\frac{1}{2}V_{cc}$, and node 14 becomes "high" as indicated by the dotted line in step e9 of FIG. 2. The "high"-state of node 14 causes the write drive signal $\phi WR$ to go "high" as shown in step e10 of FIG. 2. Accordingly, the write drive signal $\phi WR$ "falses" as a result of the ground noise generated by operation of the data output driver. The false $\phi WR$ output falls outside the timing sequence of the externally provided write enable signal WE. "As a result, read/write operation of the memory device is incorrectly performed. That is, during false operation of $\phi WR$, even if the write enable signal WE is correctly supplied, node 14 in FIG. 1 is "blocked" by ground noise such that a write operation cannot be performed during the proper "write" interval.

The write signal input buffer described above with respect to FIGS. 1 and 2 is similar to the write signal input buffer found, for example, in the 1M DRAM product TC51100 or TC51101 manufactured by Toshiba Co. In particular, the Toshiba devices include the feedback/latch circuit defined by line 24 in FIG. 1.

SUMMARY OF THE INVENTION

It is an object of the present invention to provide a semiconductor memory device having stable read/write operation.

It is another object of the present invention to provide a write signal input buffer in a semiconductor memory device, that accurately performs a write operation using an externally supplied write enable signal.

It is still another object of the present invention to provide a write signal input buffer in a semiconductor memory device in which false operation occurs due to presence of noise arising from the switching operation of a data output circuit.

It is yet another object of the present invention to provide a write signal input buffer in a semiconductor memory device that performs normal driving operation in response to an externally supplied write enable signal, regardless of the presence of ground noise arising from the switching operation of a data output circuit.

It is a further object of the present invention to provide a write signal input buffer in a semiconductor memory device that does not latch false data due to the generation of the ground noise caused by the switching operation of a data output circuit, and that generates a normal write drive signal having proper timing which corresponds to an externally supplied write enable signal.

To achieve the foregoing objects, the present invention provides a write signal input buffer having an input stage receiving an externally supplied write enable signal, a logic circuit generating a write drive signal corresponding to the output of the input stage, and a latch circuit latching an output signal of the logic circuit, wherein the latch circuit includes a switching element in a latch path.

The latch circuit in the write signal input buffer of the present invention latches the signal of output stage of the logic means, and has a switching element on its path operated by a predetermined control signal. The predetermined control signal properly controls operation of the write signal input buffer even when ground noise generated by operation of the data output circuit is present in the overall circuit. As a result, the "falsing" problem inherent in the conventional write signal input buffer is corrected.

BRIEF DESCRIPTION OF THE DRAWINGS

The above objects and other advantages of the present invention will become more apparent by describing a preferred embodiment of the present invention with reference to the attached drawings, in which.

DETAILED DESCRIPTION OF THE INVENTION

The following specific details, such as the respective control signals and circuit configuration, are given by way of example. Those skilled in this field will recognize that the present invention can be implemented with variations and modifications to the illustrative preferred embodiment described below.

The term "write signal input buffer" is used to generally describe an input buffer which receives an externally provided write enable signal, which converts the received signal to an internally compatible write drive control signal, and which provides the write drive signal as a master clock control signal to respective internal circuits within the memory device. The term "data output circuit" is used to describe a circuit which provides data stored in the memory device to external circuits during a "read" operation. The term data output circuit generally includes a data output buffer and data output driver. The term "$\phi$DOUTE" is used to indicate an internal signal related to data output which is derived from an externally provided signal. $\phi$DOUTE is defined as a signal enabling the driving operation of the output circuit. $\phi$DOUTE, as further described hereafter can be the same signal as $\phi$TRST disclosed in Korean Patent Application No. "1991-23940" or "1992-6954".

Figure 1:
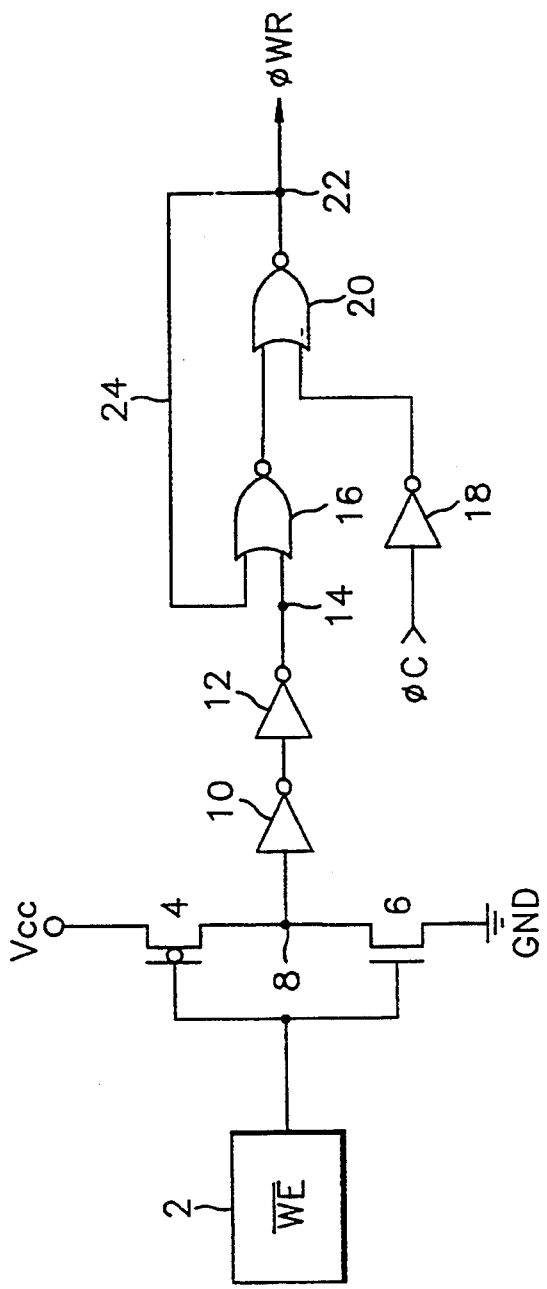
FIG. 1 is a circuit diagram showing a write signal input buffer having a latch circuit configured in the conventional manner.
Figure 2:
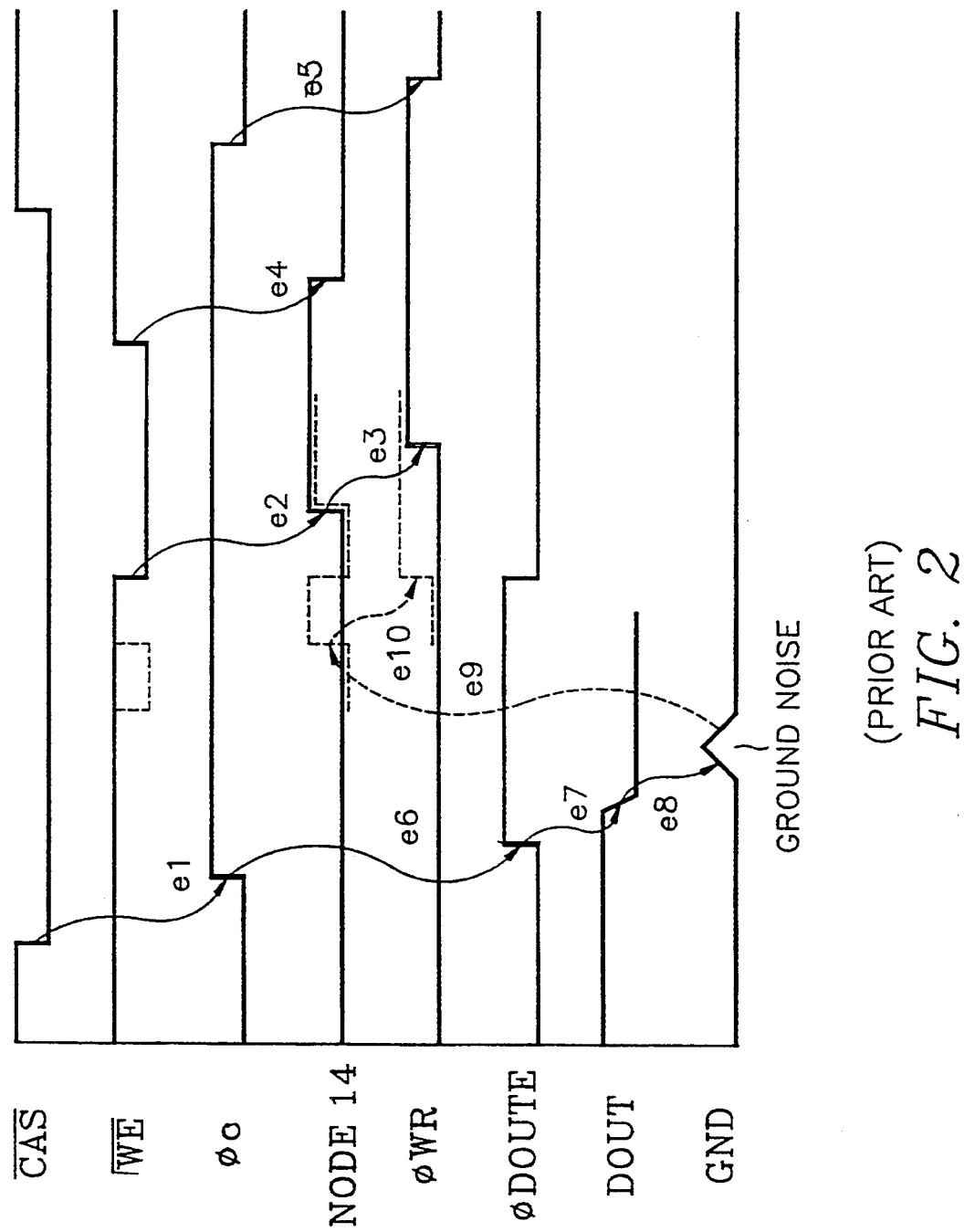
FIG. 2 is a timing diagram illustrating the operation of the write signal input buffer of FIG. 1, and further illustrating the effect of ground noise on this operation.
Figure 3:
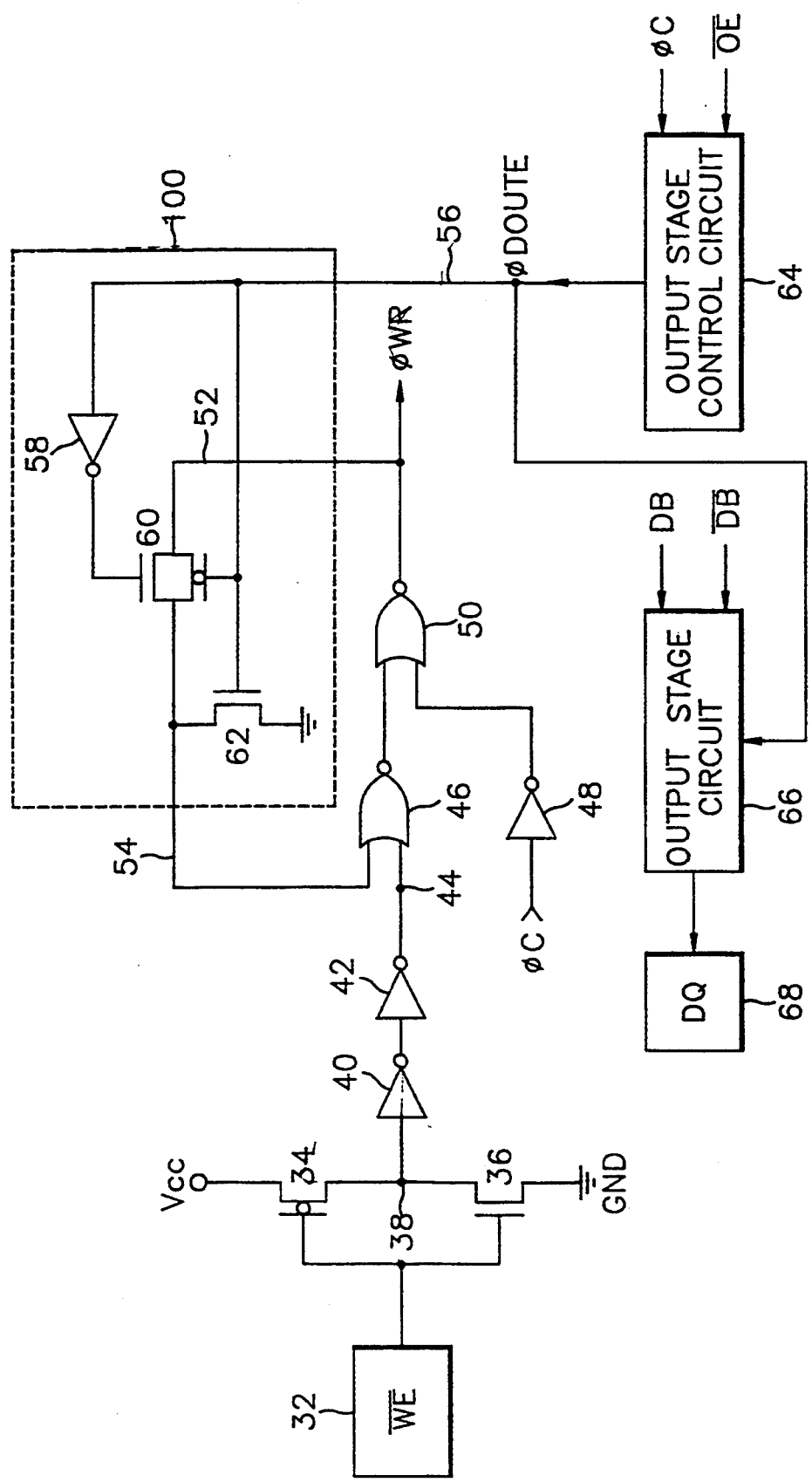
FIG. 3 is a circuit diagram showing a write signal input buffer having a latch circuit with switching element according to the present invention.

FIG. 3 is a circuit diagram illustrating a write signal input buffer having a latch circuit including a switching element according to the present invention. With reference to FIG. 3, an input circuit comprising drawing elements 32, 34, 36, and, 38, and a logic circuit comprising drawing elements 40, 42, 44, 46, 48, and, 50 are similar in configuration to the conventional write signal input buffer shown in FIG. 1.

A latch circuit 100 according to the present invention comprises line 56 connected to an output circuit control signal $\phi$DOUTE provided by output stage control circuit 64. $\phi$DOUTE is also provided as an enabling control signal to output stage circuit 66. The circuit 100 further comprises line 52 connected to the write drive signal $\phi$WR supplied from NOR gate 50, line 54 connected to one input of the NOR gate 50, a transmission gate 60 switching-connected between the lines 52 and 54. Transmission gate 60 includes a P-type terminal connected to line 56, and an N-type terminal connected to the line 56 through inverter 58. Finally, latch circuit 100 comprises a reset transistor 62 having a channel formed between line 54 and ground, and having a control terminal connected to line 56.

Figure 4:
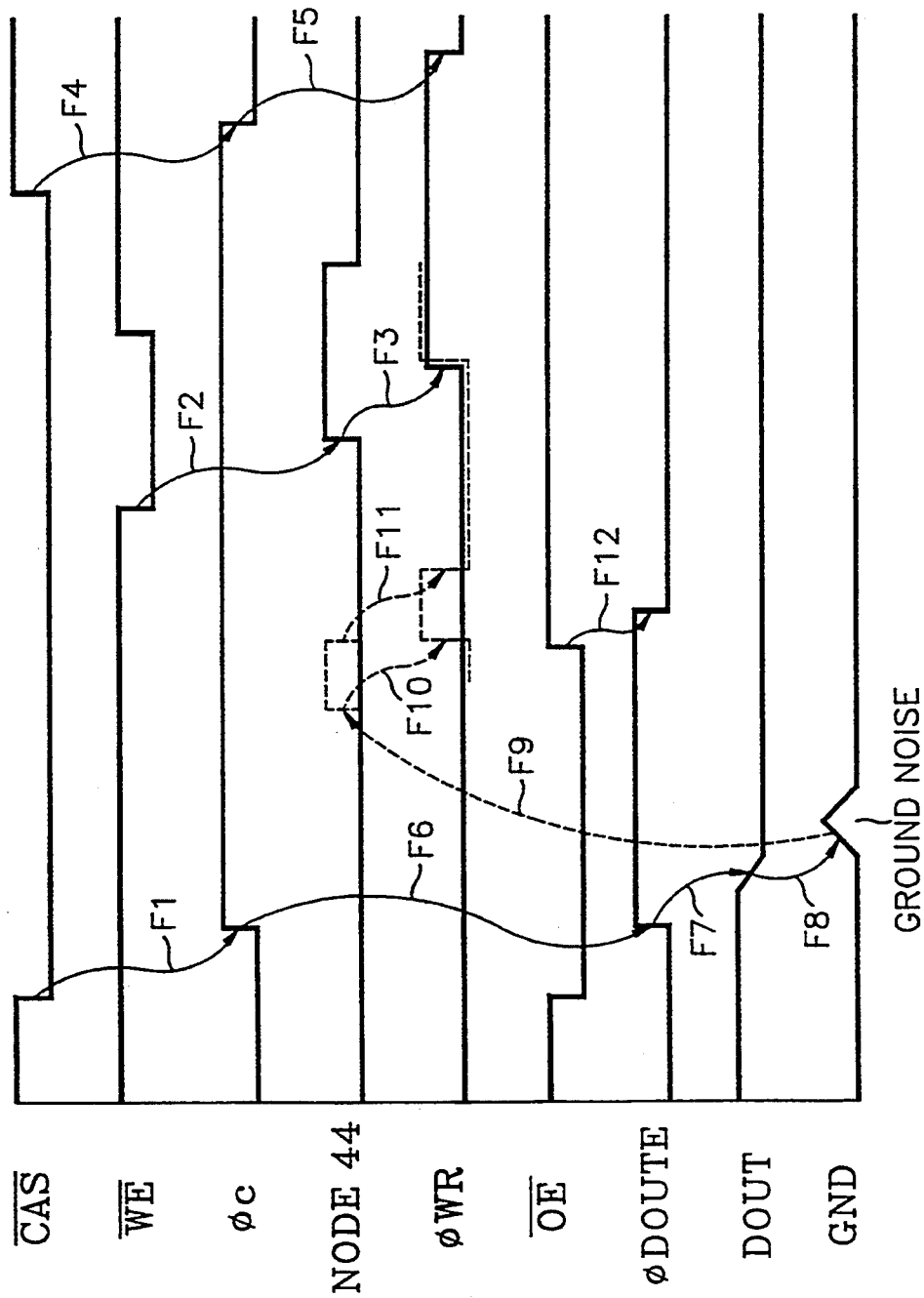
FIG. 4 is an operational timing diagram when a write signal input buffer shown in FIG. 3.

FIG. 4 is a timing diagram illustrating the operation of [when] the write signal input buffer shown in FIG. 3. In general, the write signal input buffer according to the present invention modifies the operation of the conventional feedback/latch path of the output circuit of the write signal input buffer by making such operation responsive to the presence or absence of the output stage control signal $\phi$DOUTE. The addition of this feature provides properly controlled data output regardless of the presence of ground noise within the overall memory device.

Referring to FIG. 4, memory device read/write operations are controlled by a column address strobe signal CAS. A column clocking signal, $\phi$C, is derived from CAS (F1). The output circuit control signal $\phi$DOUTE is then derived from $\phi$C (F6). A predetermined data control signal, DOUT, is supplied exterior to the chip since the data output driver of the output circuit performs data transfer operations (F7).

If ground noise is generated (F8), node 38 of FIG. 3 goes "high," and node 44 also goes "high" as shown by the dotted line in FIG. 4 (F9). A NOR gate 46 generates a "low" output regardless of the state of line 54. At this time, since column enable signal $\phi$C is "high," and the output of inverter 48 is "low," NOR gate 50 is "high"

and the write drive signal φWR also goes "high" as shown by the dotted line in FIG. 4.

Also at this time, the output stage control signal φDOUTE is "high," and the transmission gate 60 is turned off, thereby insulating lines 52 and 54. Reset transistor 62 is turned on by φDOUTE, from which line 54 is reset to "low." As shown in FIG. 4, if ground noise is not generated, nodes 38 and 44 become "low," and NOR gate 46 generates a "high" output, so that write drive signal φWR becomes "low" (F1). Once data transfer is complete, the "enabling" interval of the output stage control signal φDOUTE which is an output stage control signal is ended (F12), and accordingly, transmission gate 60 is turned on, thereby switching 52 to line 54.

As a result of the foregoing, a transient write drive signal φWR generated by ground noise is not latched at the output of the write signal input buffer as the conventional write signal input buffer. Thus, since the write enable signal WE has not been received at this point in time, the subsequent write operation is not affected.

If write enable signal WE is received at WE terminal 32 according to its proper externally derived timing, node 44 becomes "high" (F2), and, as a result, write drive signal φWR becomes "high" (F3). Here, since the output stage control signal φDOUTE is "low," transmission gate 60 is turned on, and reset transistor 62 is turned off, so that output signal φWR of the write signal input buffer according to the present invention performs a proper latch operation. Accordingly, other clock signals (not shown) derived from write drive signal φWR are correctly generated at previously determined timing intervals, so that a stable and an accurate write operation is performed.

The write signal input buffer circuit shown in FIG. 3 is a presently preferred embodiment of the present invention. However, the benefits of the present invention can be achieved if the input circuit, and/or the logic circuit are replaced in the preferred embodiment. Similarly, the transmission gate shown in the preferred embodiment can be implemented by other switching elements. Furthermore, the signal controlling the switching element can be almost any signal, but is preferably a drive signal for the data output circuit. Finally, the present invention has been drawn to a write signal input buffer, however the foregoing description is sufficient for those skilled in this field to adapt the preferred embodiment to almost any other type of input buffer having a latch circuit having a controllable switching element.

As described above, the write signal input buffer according to the present invention includes a latch circuit having a switching element whose driving operation is controlled according to a data output control signal. The present invention prohibits data falsing as the result of ground noise induced by data output operation, thereby guaranteeing correct memory device read/write operations. Reliability of the overall semiconductor memory device relative to write operations is greatly improved.

I claim:

1. A write signal input buffer in a semiconductor memory device, comprising:
   an input circuit receiving an externally provided write enable signal having and providing a first logic circuit input signal corresponding to the write enable signal;
   a logic circuit receiving the first logic circuit input signal and generating a write drive control signal in accordance with the first logic circuit input signal;
   a data output circuit responsive to a data output control signal for transferring data from the semiconductor memory device to an external circuit;
   a latch circuit latching the write drive control signal in the logic circuit for a period of time greater than a period during which the write enable signal is applied to the input circuit,
   wherein the latch circuit comprises a feedback path providing the write drive control signal to the logic circuit as a second logic circuit input signal, the feedback path comprising a switching element responsive-to the data output control signal.

2. The write drive signal input buffer of claim 1, wherein the switching element is turned off during a time period where the data output control signal enables data transfer by the data output circuit, and wherein the switching element is otherwise turned on.

3. The write drive signal input buffer of claim 2, further comprising:
   a reset transistor, responsive to the data output control signal, connecting the feedback path to ground.

* * * * *